United States Patent
Hirose et al.

(10) Patent No.: US 11,947,140 B2
(45) Date of Patent: Apr. 2, 2024

(54) SUCTIONING METHOD

(71) Applicant: HAMAMATSU PHOTONICS K.K., Hamamatsu (JP)

(72) Inventors: Masaki Hirose, Hamamatsu (JP); Katsumi Shibayama, Hamamatsu (JP); Takashi Kasahara, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 990 days.

(21) Appl. No.: 16/763,859

(22) PCT Filed: Nov. 9, 2018

(86) PCT No.: PCT/JP2018/041726
§ 371 (c)(1),
(2) Date: May 13, 2020

(87) PCT Pub. No.: WO2019/098141
PCT Pub. Date: May 23, 2019

(65) Prior Publication Data
US 2021/0364681 A1    Nov. 25, 2021

(30) Foreign Application Priority Data
Nov. 17, 2017 (JP) .................................. 2017-221853

(51) Int. Cl.
*B25B 11/00* (2006.01)
*B25J 15/06* (2006.01)
(Continued)

(52) U.S. Cl.
CPC .............. *G02B 5/284* (2013.01); *B25J 15/06* (2013.01); *H01L 21/67* (2013.01); *H01L 21/68* (2013.01)

(58) Field of Classification Search
CPC .......... H01L 21/68; H01L 21/67; B25J 15/06; B25B 11/00; B25B 11/005
See application file for complete search history.

(56) References Cited

U.S. PATENT DOCUMENTS 4,669,226 A * 6/1987 Mandler ............... B24B 13/005
                                                    451/384
2006/0049564 A1   3/2006 Tokudome
2021/0362351 A1 * 11/2021 Hirose ................... G02B 5/284

FOREIGN PATENT DOCUMENTS

| CN | 1755912 A    | 4/2006 |
| CN | 103913836 A  | 7/2014 |

(Continued)

OTHER PUBLICATIONS

International Preliminary Report on Patentability dated May 28, 2020 for PCT/JP2018/041726.

*Primary Examiner* — Lee D Wilson
(74) *Attorney, Agent, or Firm* — Faegre Drinker Biddle & Reath LLP

(57) ABSTRACT

A suction method is provided as a method of performing, by using a suction collet, suction of a Fabry-Perot interference filter including a substrate and a laminated structure that is provided on the substrate and that includes a main surface facing the side opposite to the substrate, the method including a first step of arranging the suction collet so as to face the main surface, a second step of bringing the suction collet into contact with the Fabry-Perot interference filter after the first step, and a third step of suctioning the Fabry-Perot interference filter by using the suction collet after the second step.

8 Claims, 9 Drawing Sheets

(51) Int. Cl.
  *G02B 5/28* (2006.01)
  *H01L 21/67* (2006.01)
  *H01L 21/68* (2006.01)

(56) References Cited

FOREIGN PATENT DOCUMENTS

| | | | | |
|---|---|---|---|---|
| CN | 105291545 | A | | 2/2016 |
| CN | 105683725 | A | | 6/2016 |
| CN | 105705920 | A | | 6/2016 |
| CN | 108780007 | A * | 11/2018 | ................ G01J 1/04 |
| CN | 109196404 | A * | 1/2019 | ......... B23K 26/0006 |
| EP | 3064912 | A1 | | 9/2016 |
| JP | H1-081633 | U | | 5/1989 |
| JP | H03-81633 | U | | 8/1991 |
| JP | H4-188840 | A | | 7/1992 |
| JP | 2004-157292 | A | | 6/2004 |
| JP | 2005-509897 | A | | 4/2005 |
| JP | 2006-073839 | A | | 3/2006 |
| JP | 2008-053306 | A | | 3/2008 |
| JP | 2013-506154 | A | | 2/2013 |
| JP | 2015-152713 | A | | 8/2015 |
| KR | 1020140056730 | A | | 5/2014 |
| KR | 1020160079768 | A | | 7/2016 |
| KR | 1020160120277 | A | | 10/2016 |
| TW | 200412616 | A | | 7/2004 |
| TW | 200537635 | A | | 11/2005 |
| TW | 200722936 | A | | 6/2007 |
| TW | 200741917 | A | | 11/2007 |
| TW | 200828456 | A | | 7/2008 |
| TW | 201319761 | A | | 5/2013 |
| WO | WO-03/042729 | A1 | | 5/2003 |
| WO | WO-2011/036346 | A1 | | 3/2011 |
| WO | WO-2015/064749 | A1 | | 5/2015 |

\* cited by examiner (a)

(b)

SUCTIONING METHOD

TECHNICAL FIELD

One aspect of the present invention relates to a suction method.

BACKGROUND ART

In the related art, a Fabry-Perot interference filter, which includes a substrate, a fixed mirror and a movable mirror facing each other via a gap on the substrate, and an intermediate layer defining the gap, is known (for example, refer to Patent Literature 1).

CITATION LIST

Patent Literature

Patent Literature 1: Japanese Unexamined Patent Publication No. 2013-506154

SUMMARY OF INVENTION

Technical Problem

In individual conveyance of Fabry-Perot interference filter chips as described above, the chips can be transported while being individually suctioned by using a suction collet, for example. In this case, when release of the suction, it is desirable that change in the posture and position of the Fabry-Perot filter is suppressed, and stable detachment of the Fabry-Perot filter from the suction collet is achieved.

An object of one aspect of the present invention is to provide a suction method capable of stable detachment of a Fabry-Perot interference filter.

Solution to Problem

A suction collet according to one aspect of the present invention is a suction method of performing suction of a Fabry-Perot interference filter including a substrate and a laminated structure that is provided on the substrate and that includes a main surface facing the side opposite to the substrate, by using a suction collet, the method including: a first step of arranging the suction collet so as to face the main surface; a second step of bringing the suction collet into contact with the Fabry-Perot interference filter after the first step; and a third step of suctioning the Fabry-Perot interference filter by using the suction collet after the second step, in which the suction collet includes a main body having a surface and includes a contact portion that is provided on the surface so as to protrude from the surface and that includes a pair of first contact surfaces provided with an opening for air intake, the laminated structure includes: a membrane structure including a first mirror portion and a second mirror portion facing each other via a gap and in which a distance from each other is variable and including a portion of a main surface; and a pair of first electrode terminals disposed so as to face each other via the membrane structure when viewed in a direction intersecting the main surface, in the first step, the suction collet is disposed such that the surface faces the main surface and each of the first contact surfaces faces each of the first electrode terminals, in the second step, each of the first contact surfaces is brought into contact with each of the first electrode terminals, and in the third step, each of the first electrode terminals is suctioned to the first contact surface by air intake through the opening provided on the first contact surface.

The Fabry-Perot interference filter to be a suction object for this suction method includes a substrate and a laminated structure provided on the substrate. The laminated structure includes: a membrane structure including a first mirror portion and a second mirror portion facing each other via a gap and in which a distance from each other is variable; and a pair of first electrode terminals disposed to face each other via the membrane structure. In contrast, in the suction collet used in this suction method, the contact portion protruding from the surface of the main body includes the first contact surface having the opening for air intake. In addition, in the first step, the suction collet is disposed such that the surface of the suction collet faces the main surface of the Fabry-Perot interference filter. At this time, each of the first contact surfaces is arranged so as to face each of the first electrode terminals. Subsequently, in the second step, the suction collet is brought into contact with the Fabry-Perot interference filter. At this time, each of the first contact surfaces is brought into contact with each of the first electrode terminals. Subsequently, in the third step, the Fabry-Perot interference filter is suctioned by using the suction collet. At this time, each of the first electrode terminals is suctioned to the first contact surface by the air intake through the opening of the first contact surface. This makes it possible to suction a limited range such as the first electrode terminal in the suction of the Fabry-Perot interference filter. This enables implementation of appropriate level of suction, making it possible to stably detach the Fabry-Perot interference filter when the suction is released.

In the suction method according to one aspect of the present invention, the first electrode terminal may include a top surface protruding from the main surface and in the second step, the first contact surface may be brought into contact with the top surface. In this case, the second step brings the first contact surface of the contact portion into contact with the first electrode terminal protruding from the membrane structure. This can avoid contact of the suction collet with the membrane structure, or even when contact occurs, it is possible to reduce the load on the membrane structure. Accordingly, it is possible to avoid breakage in the membrane structure in the suction of the Fabry-Perot interference filter, leading to suppression of the occurrence of faulty Fabry-Perot interference filters.

In the suction method according to one aspect of the present invention, an edge located on the membrane structure side of the first contact surface in a state where the first contact surface may be in contact with the first electrode terminal has a shape corresponding to an outer edge of the membrane structure, and in the first step, the suction collet may be arranged such that the edge is located outside the membrane structure and follows the outer edge of the membrane structure in a state where the first contact surface is in contact with the first electrode terminal. In this case, it is possible to avoid contact with the membrane structure in the suction of the Fabry-Perot interference filter.

In the suction method according to one aspect of the present invention, the membrane structure may have a circular shape when viewed in a direction intersecting the main surface, and the edge may be formed in an arc shape so as to follow the outer edge of the membrane structure. In this case, it is possible to reliably avoid contact with the membrane structure when the Fabry-Perot interference filter is suctioned.

In the suction method according to one aspect of the present invention, in the first step, the suction collet may be arranged such that the opening is partially offset from the first electrode terminal in a state where the first contact surface is in contact with the first electrode terminal. In this case, it is possible to avoid an excessive increase in the suction force and possible to further stably detach the Fabry-Perot interference filter.

In the suction method according to one aspect of the present invention, the suction collet may include a guide portion provided on the surface so as to protrude from the surface on an axis intersecting a direction from one first contact surface to the other first contact surface, the first electrode terminal is each provided at a corner portion of the laminated structure when viewed in a direction intersecting the main surface, and in the first step, the suction collet may be arranged such that, outside a certain corner portion of the laminated structure which is different from a corner portion provided with the first electrode terminal, the guide portion follows the certain corner portion, in a state where the first contact surface is in contact with the first electrode terminal. In this case, the guide portion regulates a change in the posture of the Fabry-Perot interference filter, making it possible to stably hold and detach the filter.

In the suction method according to one aspect of the present invention, the guide portion may be bent and extended along the outer edge of the certain corner portion in a state where the first contact surface is in contact with the first electrode terminal. In this case, the guide portion regulates the rotation of the Fabry-Perot interference filter in a plane along the main surface, making it possible to further stably hold and detach the filter.

In the suction method according to one aspect of the present invention, the Fabry-Perot interference filter may include a pair of second electrode terminals disposed so as to face each other via the membrane structure when viewed in a direction intersecting the main surface, the second electrode terminal may be disposed on an axis intersecting a facing direction of the first electrode terminals, the contact portion may include a second contact surface disposed so as to correspond to the second electrode terminal and provided with an opening for air intake, in the first step, the suction collet may be arranged such that each of the second contact surfaces faces each of the second electrode terminals, in the second step, each of the second contact surfaces may be brought into contact with each of the second electrode terminals, and in the third step, each of the second electrode terminals may be suctioned to the second contact surface by intake air through the opening provided in the second contact surface. In this case, the suction can be performed through the openings arranged at least at three mutually different positions, making it possible to further stably suction and hold the Fabry-Perot interference filter.

Advantageous Effects of Invention

According to one aspect of the present invention, it is possible to provide a suction method capable of stably detaching a Fabry-Perot interference filter.

DESCRIPTION OF EMBODIMENTS

Figure 1:
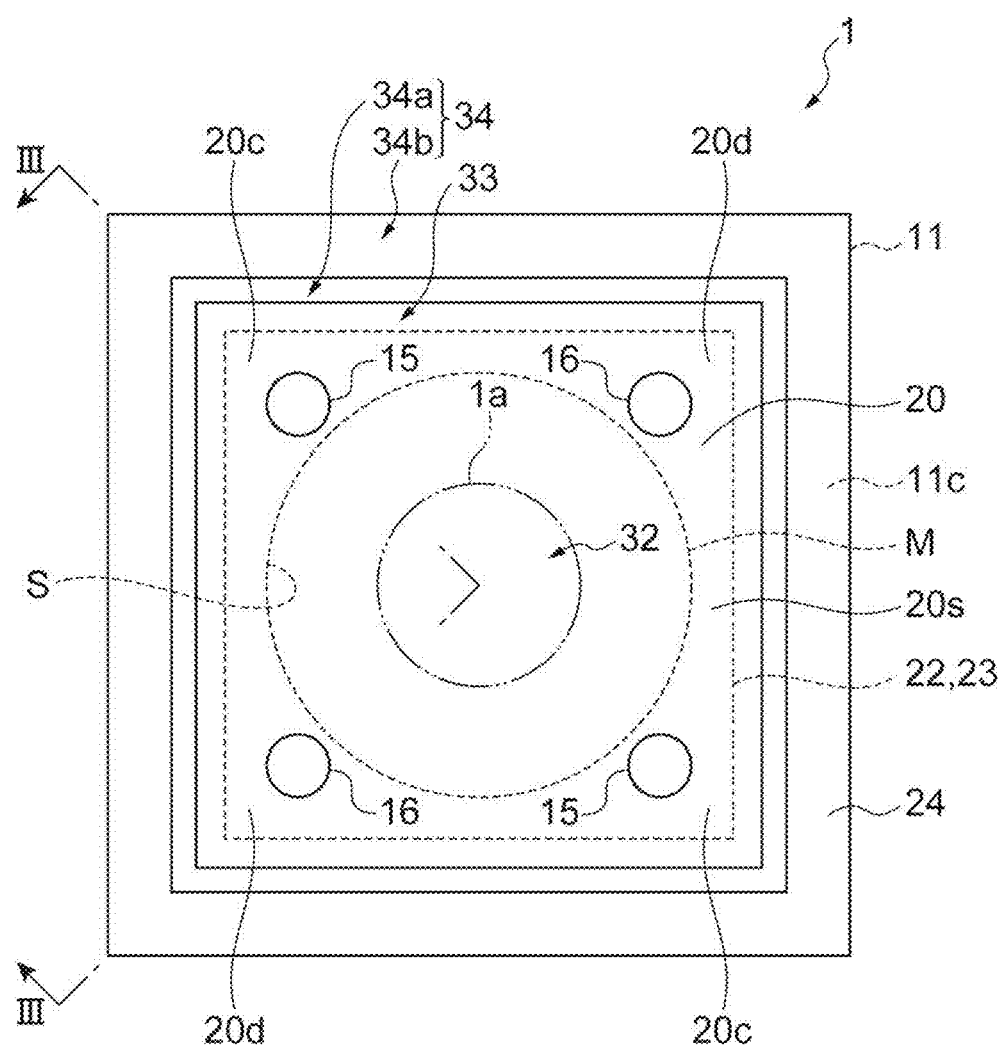
FIG. 1 is a plan view of a Fabry-Perot interference filter of the present embodiment.

Hereinafter, an embodiment will be described in detail with reference to the drawings. In each of the drawings, the same elements or corresponding elements will be denoted by the same reference numerals, and redundant description will be omitted in some cases.

A suction method according to the present embodiment uses a suction collet to perform suction of a Fabry-Perot interference filter. Therefore, an embodiment of a Fabry-Perot interference filter as a suction object will be described first.

[Configuration of Fabry-Perot Interference Filter]

Figure 2:
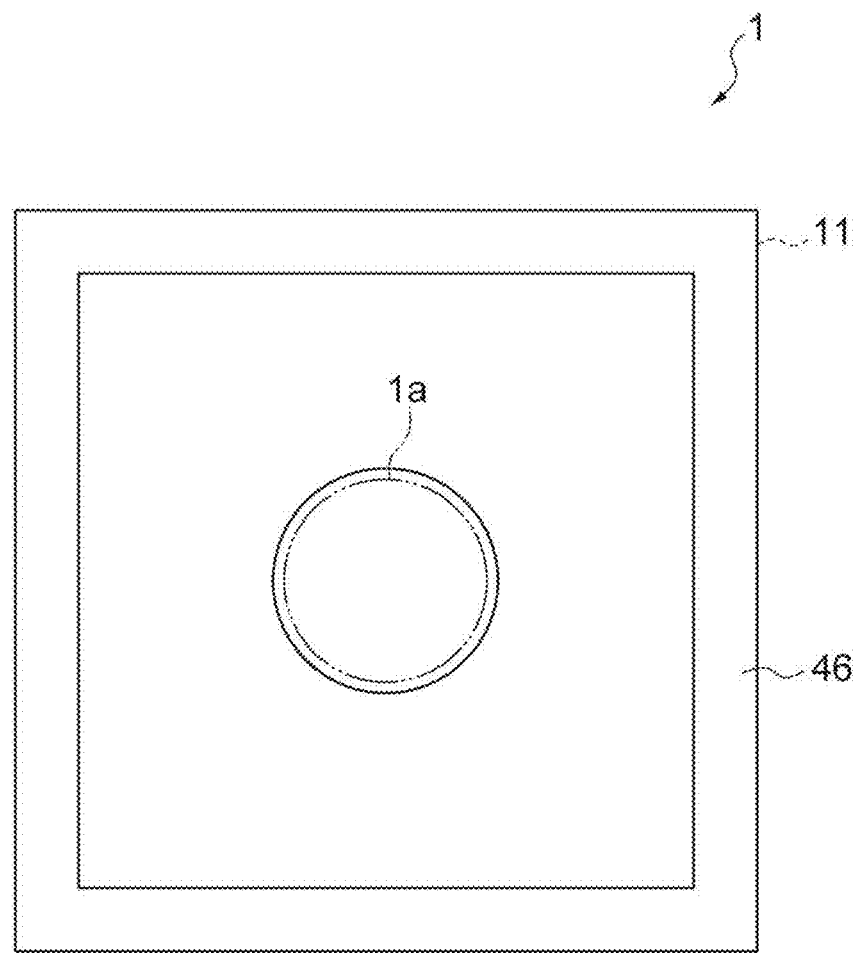
FIG. 2 is a bottom view of the Fabry-Perot interference filter illustrated in FIG. 1.
Figure 3:
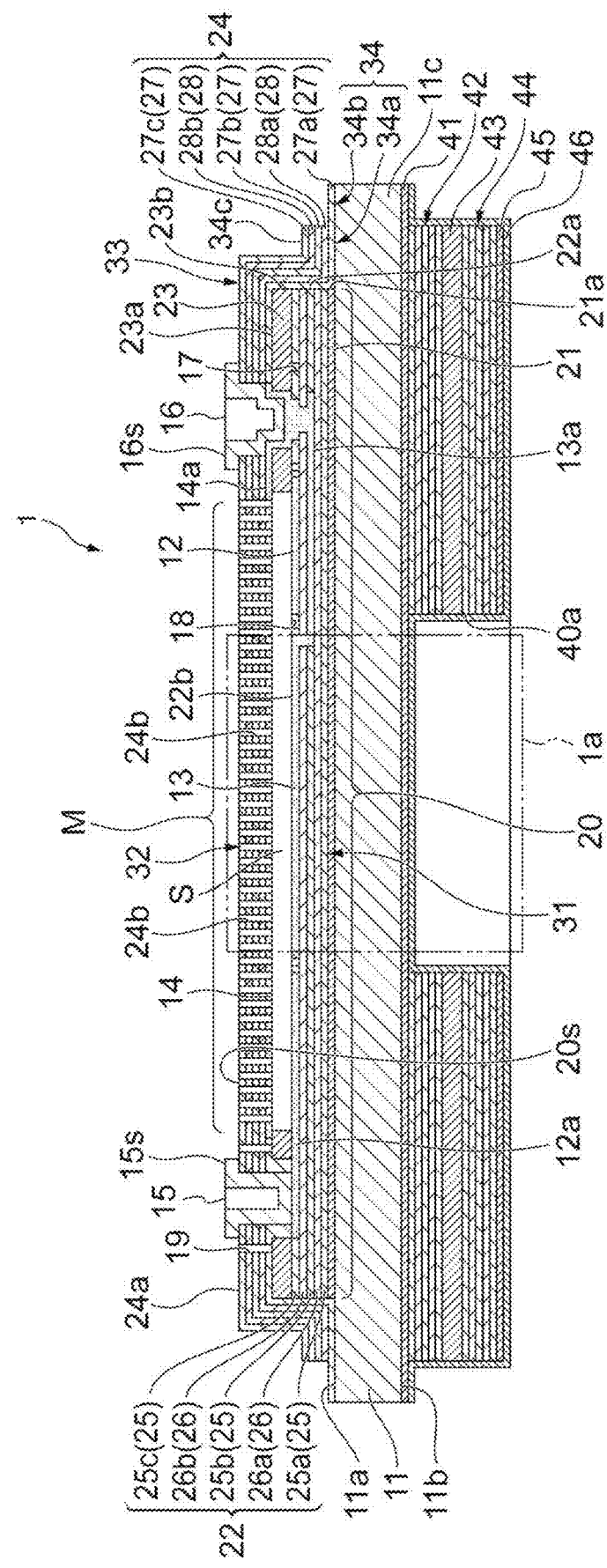
FIG. 3 is a cross-sectional view of the Fabry-Perot interference filter taken along line III-III in FIG. 1.

FIG. 1 is a plan view of a Fabry-Perot interference filter of the present embodiment. FIG. 2 is a bottom view of the Fabry-Perot interference filter illustrated in FIG. 1. FIG. 3 is a cross-sectional view of the Fabry-Perot interference filter taken along line III-III in FIG. 1.

As illustrated in FIGS. 1 to 3, a Fabry-Perot interference filter 1 includes a substrate 11. The substrate 11 has a first surface 11a and a second surface 11b opposite to the first surface 11a. On the first surface 11a, a reflection prevention layer 21, a first laminate 22, an intermediate layer 23, and a second laminate 24 are laminated in this order. A gap (air gap) S is defined between the first laminate 22 and the second laminate 24 by the frame-like intermediate layer 23. The first laminate 22, the intermediate layer 23, and a portion of the second laminate 24 located on the first laminate 22 when viewed in a direction intersecting (orthogonal to) the first surface 11a constitutes a laminated structure 20. The laminated structure 20 is provided on the first surface 11a of the substrate 11, and includes a main surface 20s facing the opposite side of the substrate 11. The main surface 20s is a portion of the surface 24a of the second laminate 24.

The shape and the positional relationship of each of portions when viewed in a direction perpendicular to the first surface 11a (plan view) are as follows. For example, an outer edge of the substrate 11 has a rectangular shape. The outer edge of the substrate 11 is aligned with an outer edge of the second laminate 24. An outer edge of the reflection prevention layer 21, an outer edge of the first laminate 22, and an outer edge of the intermediate layer 23 are aligned with each other. Therefore, the laminated structure 20 is also rectangular in plan view (when viewed in a direction intersecting (orthogonal to) the main surface 20s). The substrate 11 has an outer edge portion 11c positioned outside the outer edge of the intermediate layer 23 with respect to the center of the gap S. For example, the outer edge portion 11c has a frame shape and surrounds the intermediate layer 23 when viewed in a direction perpendicular to the first surface 11a.

The Fabry-Perot interference filter 1 transmits light having a predetermined wavelength through a light transmission region 1a defined in a center portion of the Fabry-Perot interference filter 1. For example, the light transmission region 1a is a columnar region. The substrate 11 is formed of silicon, quartz, glass, or the like, for example. When the substrate 11 is formed of silicon, the reflection prevention layer 21 and the intermediate layer 23 are formed of silicon oxide, for example. The thickness of the intermediate layer 23 is several tens of nm or more and several tens of μm or less, for example.

A portion corresponding to the light transmission region 1a in the first laminate 22 functions as a first mirror portion 31. The first mirror portion 31 is disposed on the first surface 11a via the reflection prevention layer 21. The first laminate 22 includes alternate laminations of each of a plurality of polysilicon layers 25 and each of a plurality of silicon nitride layers 26. In the present embodiment, a polysilicon layer 25a, a silicon nitride layer 26a, a polysilicon layer 25b, a silicon nitride layer 26b, and a polysilicon layer 25c are laminated on the reflection prevention layer 21 in this order. The optical thickness of each of the polysilicon layers 25 and the silicon nitride layers 26 included in the first mirror portion 31 can be set to an integral multiple of ¼ of a center transmission wavelength. The first mirror portion 31 may be directly disposed on the first surface 11a without interposing the reflection prevention layer 21.

The portion corresponding to the light transmission region 1a in the second laminate 24 functions as a second mirror portion 32. The second mirror portion 32 faces the first mirror portion 31 via the gap S on a side opposite to the substrate 11 with respect to the first mirror portion 31. The second laminate 24 is disposed on the first surface 11a via the reflection prevention layer 21, the first laminate 22, and the intermediate layer 23. The second laminate 24 includes alternate laminations of each of the plurality of polysilicon layers 27 and each of the plurality of silicon nitride layers 28. In the present embodiment, a polysilicon layer 27a, a silicon nitride layer 28a, a polysilicon layer 27b, a silicon nitride layer 28b, and a polysilicon layer 27c are laminated on the intermediate layer 23 in this order. The optical thickness of each of the polysilicon layers 27 and the silicon nitride layers 28 included in the second mirror portion 32 can be set to an integral multiple of ¼ of a center transmission wavelength.

In the first laminate 22 and the second laminate 24, silicon oxide layers may be used in place of the silicon nitride layers. In addition, examples of the material applicable for each of layers forming the first laminate 22 and the second laminate 24 include titanium oxide, tantalum oxide, zirconium oxide, magnesium fluoride, aluminum oxide, calcium fluoride, silicon, germanium, zinc sulfide, or the like. Here, the surface of the first mirror portion 31 on the gap S side (surface of the polysilicon layer 25c) and the surface of the second mirror portion 32 on the gap S side (surface of the polysilicon layer 27a) directly face each other via the gap S. Note that an electrode layer, a protective layer, or the like (not forming a mirror) may be formed on the surface of the first mirror portion 31 on the gap S side and on the surface of the second mirror portion 32 on the gap S side. In this case, the first mirror portion 31 and the second mirror portion 32 face each other via the gap S with the presence of these interposed layers. In other words, even in such a case, a facing configuration between the first mirror portion 31 and the second mirror portion 32 via the gap S can be achieved.

A plurality of through-holes 24b ranging from a surface 24a (main surface 20s of the laminated structure 20) of the second laminate 24 on a side opposite to the intermediate layer 23 to the gap S is formed at a portion of the second laminate 24 corresponding to the gap S. The plurality of through-holes 24b is formed so as not to substantially influence the function of the second mirror portion 32. The plurality of through-holes 24b is used for forming the gap S by removing a portion of the intermediate layer 23 through etching.

In addition to the second mirror portion 32, the second laminate 24 further includes a covering portion 33 and a peripheral edge portion 34. The second mirror portion 32, the covering portion 33, and the peripheral edge portion 34 are integrally formed to have a portion of a same laminated structure and to be continuous to each other. The covering portion 33 surrounds the second mirror portion 32 when viewed in a direction perpendicular to the first surface 11a. The covering portion 33 covers a surface 23a of the intermediate layer 23 on a side opposite to the substrate 11, a side surface 23b of the intermediate layer 23 (outer side surface, that is, a side surface on a side opposite to the gap S side), a side surface 22a of the first laminate 22, and a side surface 21a of the reflection prevention layer 21, so as to reach the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 when viewed in a direction perpendicular to the first surface 11a. The peripheral edge portion 34 is positioned on the first surface 11a in the outer edge portion 11c. The outer edge of the peripheral edge portion 34 is aligned with the outer edge of the substrate 11 when viewed in a direction perpendicular to the first surface 11a.

The peripheral edge portion 34 is thinned along an outer edge of the outer edge portion 11c. That is, the portion along the outer edge of the outer edge portion 11c in the peripheral edge portion 34 is thinner compared to other portions excluding the portion along the outer edge of the peripheral edge portion 34. In the present embodiment, a portion of the polysilicon layer 27 and the silicon nitride layer 28 included in the second laminate 24 has been removed, thereby thinning the peripheral edge portion 34. The peripheral edge portion 34 includes a non-thinned portion 34a continuous to the covering portion 33, and a thinned portion 34b surrounding the non-thinned portion 34a. In the thinned portion 34b, the polysilicon layer 27 and the silicon nitride layer 28 are removed excluding the polysilicon layer 27a directly provided on the first surface 11a.

In this manner, the Fabry-Perot interference filter 1 further includes, in addition to the laminated structure 20, the thinned portion 34b that is located outside the laminated structure 20 and recessed to the substrate 11 side with respect to the main surface 20s when viewed in the direction intersecting (orthogonal to) the main surface 20s. The thinned portion 34b is formed in a loop shape (here, a rectangular loop shape) so as to surround the laminated structure 20 when viewed in the direction intersecting (orthogonal to) the main surface 20s. The thinned portion 34b is used, for example, when cutting a wafer in which a plurality of regions corresponding to the Fabry-Perot interference filter 1 is formed, for each of the Fabry-Perot interference filters 1. The thinned portion 34b is formed by etching a laminated structure for the second laminate 24.

The height of a surface 34c of the non-thinned portion 34a on a side opposite to the substrate 11 from the first surface 11a is lower than the height of the surface 23a of the intermediate layer 23 from the first surface 11a. The height of the surface 34c of the non-thinned portion 34a from the first surface 11a ranges from 100 nm to 5000 nm, for example. The height of the surface 23a of the intermediate layer 23 from the first surface 11a is a height greater than the height of the surface 34c of the non-thinned portion 34a from the first surface 11a in a range from 500 nm to 20000 nm, for example. The width of the thinned portion 34b (distance between an outer edge of the non-thinned portion 34a and the outer edge of the outer edge portion 11c) is 0.01 times the thickness of the substrate 11, or more. The width of the thinned portion 34b ranges from 5 μm to 400 μm, for example. The thickness of the substrate 11 ranges from 500 μm to 800 μm, for example.

A first electrode 12 is formed in the first mirror portion 31 so as to surround that the light transmission region 1a. The first electrode 12 is formed by doping impurities into the polysilicon layer 25c to achieve low resistivity. A second electrode 13 is formed in the first mirror portion 31 so as to surround the light transmission region 1a. The second electrode 13 is formed by doping impurities into the polysilicon layer 25c to achieve low resistivity. Note that although the second electrode 13 can be sized to include the entire light transmission region 1a, the second electrode 13 may be set to substantially the same size as that of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a to achieve low resistivity.

A pair of terminals (first electrode terminals) 15 is provided to face each other via the light transmission region 1a. Each of the terminals 15 is disposed in a through-hole ranging from the surface 24a of the second laminate 24 (main surface 20s of the laminated structure 20) to the first laminate 22. Each of the terminals 15 is electrically connected to the first electrode 12 through wiring 12a. For example, the terminal 15 is formed from a metal film of aluminum, an alloy thereof, or the like.

A pair of terminals (second electrode terminals) 16 is provided to face each other via the light transmission region 1a. Each of the terminals 16 is disposed in a through-hole ranging from the surface 24a of the second laminate 24 (main surface 20s of the laminated structure 20) to the first laminate 22. Each of the terminals 16 is electrically connected to the second electrode 13 through wiring 13a and is electrically connected to the third electrode 14 through wiring 14a. For example, the terminals 16 are formed with a metal film of aluminum, an alloy thereof, or the like. The facing direction of the pair of terminals 15 and the facing direction of the pair of terminals 16 are orthogonal to each other (refer to FIG. 1).

Trenches 17 and 18 are provided on a surface 22b of the first laminate 22. The trench 17 annularly extends to surround a connection with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13). Each of the regions in the trenches 17 and 18 may be an insulating material or a gap.

A trench 19 is provided on the surface 24a of the second laminate 24 (main surface 20s of the laminated structure 20). The trench 19 annularly extends to surround the terminals 15. The trench 19 electrically insulates the terminals 15 and the third electrode 14 from each other. The region inside the trench 19 may be an insulating material or a gap.

The second surface 11b of the substrate 11 includes layers of a reflection prevention layer 41, a third laminate 42, an intermediate layer 43, and a fourth laminate 44 laminated in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 with respect to the substrate 11. The reflection prevention layer 41, the third laminate 42, the intermediate layer 43, and the fourth laminate 44 have a function of suppressing warpage of the substrate 11.

The third laminate 42, the intermediate layer 43, and the fourth laminate 44 are thinned along the outer edge of the outer edge portion 11c. That is, the portion along the outer edge of the outer edge portion 11c in the third laminate 42, the intermediate layer 43, and the fourth laminate 44 is thinner compared to other portions excluding the portion along the outer edge in the third laminate 42, the intermediate layer 43, and the fourth laminate 44. In the present embodiment, the third laminate 42, the intermediate layer 43, and the fourth laminate 44 are thinned by removing the entirety of the third laminate 42, the intermediate layer 43, and the fourth laminate 44 in a part overlapping the thinned portion 34b when viewed in a direction perpendicular to the first surface 11a.

The third laminate 42, the intermediate layer 43, and the fourth laminate 44 has an opening 40a provided to include the light transmission region 1a. The opening 40a has a diameter approximately the same as the size of the light transmission region 1a. The opening 40a opens on a light emission side, having a bottom surface of the opening 40a reaching the reflection prevention layer 41.

A light shielding layer 45 is formed on a surface of the fourth laminate 44 on the light emission side. For example, the light shielding layer 45 is formed of aluminum. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is formed of aluminum oxide. An optical influence due to the protective layer 46 can be disregarded by causing the thickness of the protective layer 46 to range from 1 nm to 100 nm (approximately 30 nm, for example).

In the Fabry-Perot interference filter 1 configured as described above, when a voltage is applied between the first electrode 12 and the third electrode 14 via the pair of terminals 15 and 16, an electrostatic force corresponding to the voltage is generated between the first electrode 12 and the third electrode 14. The second mirror portion 32 is attracted to the first mirror portion 31 side secured to the substrate 11 due to the electrostatic force, and the distance between the first mirror portion 31 and the second mirror portion 32 is adjusted. In this manner, in the Fabry-Perot interference filter 1, the distance between the first mirror portion 31 and the second mirror portion 32 is variable.

The wavelength of light transmitted through the Fabry-Perot interference filter 1 depends on the distance between the first mirror portion 31 and the second mirror portion 32 in the light transmission region 1a. Therefore, the wavelength of transmitted light can be appropriately selected by adjusting the voltage to be applied between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while the voltage to be applied to the Fabry-Perot interference filter 1 is changed (that is, while the distance between the first mirror portion 31 and the second mirror portion 32 is changed in the Fabry-Perot interference filter 1).

In this manner, the laminated structure 20 includes the membrane structure M having the first mirror portion 31 and the second mirror portion 32 facing each other via the gap S and in which a distance from each other is variable and having a portion of the main surface 20s (here, a circular area on the center side). The membrane structure M is a portion of the laminated structure 20 not overlapping the intermediate layer 23 when viewed in the direction intersecting (orthogonal to) the main surface 20s. That is, the outer shape of the membrane structure M when viewed in the direction intersecting (orthogonal to) the main surface 20s is defined by an inner edge of the intermediate layer 23, illustrated here in a circular shape (refer to FIG. 1).

In the present embodiment, the membrane structure M is located between the pair of terminals 15, between the pair of terminals 16, and between the terminal 15 and the terminal 16 when viewed in the direction intersecting (orthogonal to) the main surface 20s. In other words, in this example, the pair of terminals 15, the pair of terminals 16, and the terminals 15-16 are each arranged to face each other via the membrane structure M. The terminals 15 and 16 are located outside the membrane structure M when viewed in the direction intersecting (orthogonal to) the main surface 20s.

As an example, the terminals 15 are provided at a pair of corner portions 20c on a diagonal line among the four corner portions of the rectangular laminated structure 20 when viewed in the direction intersecting (orthogonal to) the main surface 20s. Furthermore, as an example, the terminals 16 are provided at a different pair of corner portions 20d on another diagonal line among the four corner portions of the rectangular laminated structure 20 when viewed in the direction intersecting (orthogonal to) the main surface 20s. In other words, the terminals 16 are disposed on an axis intersecting (orthogonal to) the facing direction of the terminals 15. The terminal 15 has a top surface 15s protruding from the main surface 20s. The terminal 16 has a top surface 16s protruding from the main surface 20s. Here, the top surfaces 15s and 16s are substantially parallel to the main surface 20s.

[Configuration of Suction Collet]

Subsequently, a suction collet for suctioning the above Fabry-Perot interference filter 1 will be described. The suction collet according to the present embodiment is applicable in a case, for example, where one chip is to be picked up from a chip group of a Fabry-Perot interference filter 1 manufactured by cutting a wafer so as to be conveyed to a predetermined position, or where a Fabry-Perot interference filter 1 placed at a predetermined position is to be picked up and further conveyed to an installation location.

Figure 4:
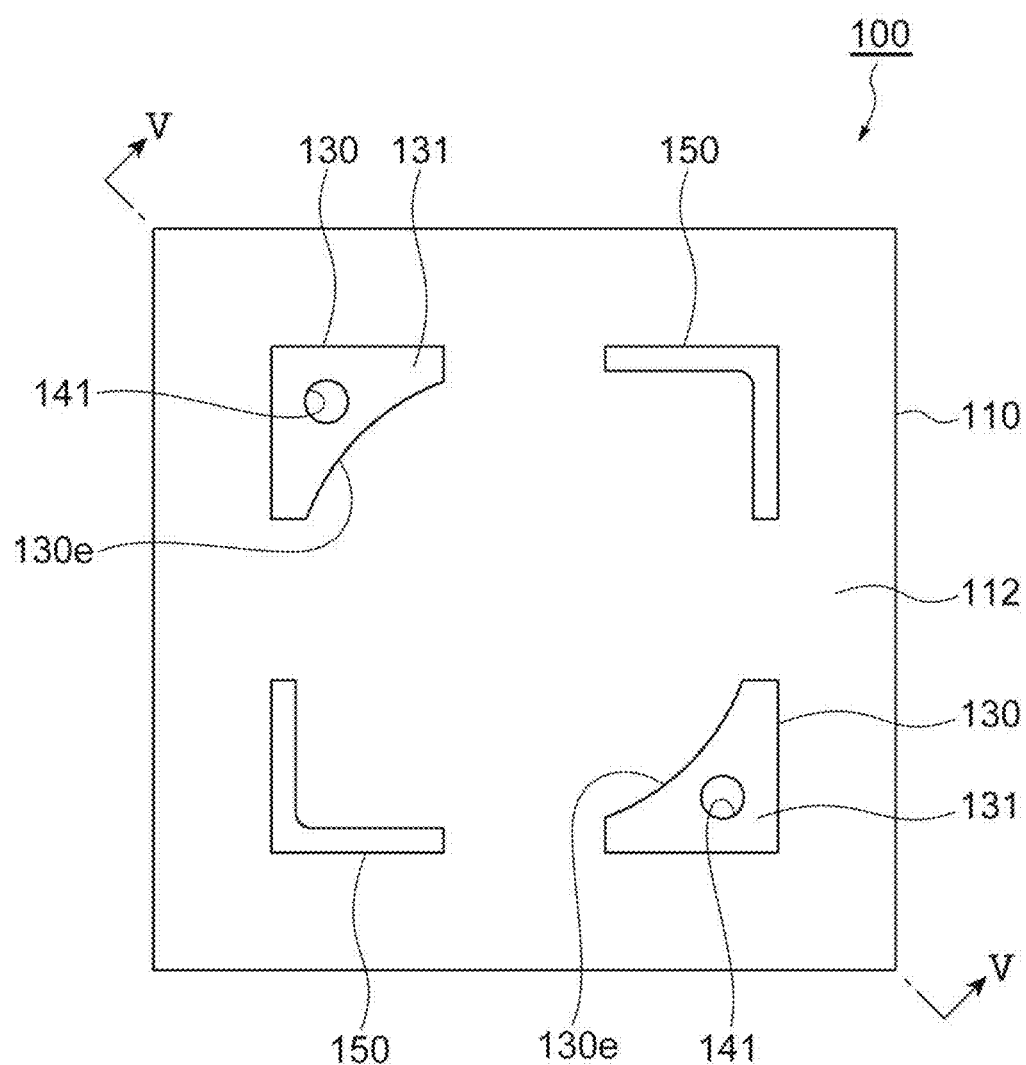
FIG. 4 is a view illustrating a suction collet according to the present embodiment.
Figure 5:
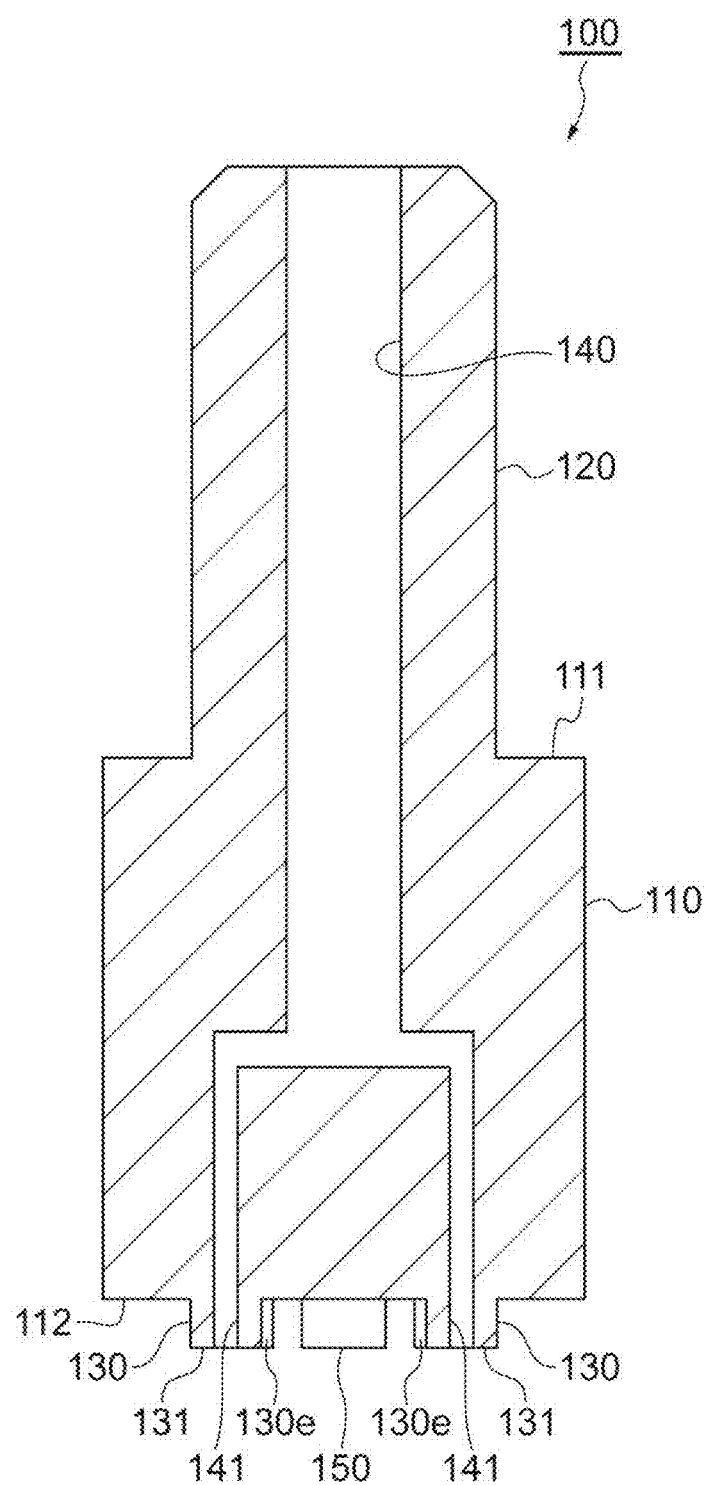
FIG. 5 is a view illustrating a suction collet according to the present embodiment.

FIGS. 4 and 5 are views each illustrating a suction collet according to the present embodiment. FIG. 4 is a bottom view, and FIG. 5 is a cross-sectional view taken along line V-V of FIG. 4. As illustrated in FIGS. 4 and 5, a suction collet 100 includes a main body 110, an extending portion 120, and a pair of contact portions 130. Here, the main body 110, the extending portion 120, and the contact portion 130 are formed integrally with each other, but may be formed separately from each other to be joined thereafter.

The main body 110 has a rectangular parallelepiped shape, for example. The main body 110 has a surface 111 and a surface 112 opposite to the surface 111. The extending portion 120 is provided on the surface 111 so as to protrude from the surface 111, and extends in a direction intersecting the surface 111. The extending portion 120 has a columnar shape having a diameter shorter than the length of one side of the main body 110 when viewed in the direction intersecting the surface 111 and is disposed inside the outer edge of the surface 111. This configuration gives the surface 111 an annular shape in which an outer shape is a rectangular shape and an inner edge has a circular shape. The extending portion 120 is applicable in connecting the suction collet 100 to a device (not illustrated) for driving the suction collet 100.

The surface 112 has a shape corresponding to the outer shape of the Fabry-Perot interference filter 1 and an example of this is rectangular (for example, square). The contact portion 130 is provided on the surface 112 so as to protrude from the surface 112. The contact portion 130 is a portion that comes into contact with the Fabry-Perot interference filter 1 at suction of the Fabry-Perot interference filter 1. An intake hole 140 is provided for the main body 110, the extending portion 120, and the contact portion 130 so as to extend over the entire length of the main body 110, the extending portion 120, and the contact portion 130. The intake hole 140 opens on a surface of the contact portion 130 opposite to the surface 112 (a contact surface 131 described below) while opening on an end of the extending portion 120 on the side opposite to the main body 110. The intake hole 140 can be connected to an intake device (not illustrated) such as a pump via an opening on the extending portion 120 side. In addition, the intake hole 140 need not be provided to extend over the entire length of the main body 110 and the extending portion 120. For example, the intake hole 140 may form an opening up to the outer side surface (the surface intersecting the surface 112) of the main body 110. Furthermore, the air intake hole 140 may form an opening to reach an outer side surface of the contact portion 130 (surface intersecting the contact surface 131 described below) rather than reaching the main body 110. In this case, the intake hole 140 can be connected to the intake device via the opening on the outer side surface of the main body 110 or the contact portion 130.

The contact portions 130 face each other and are spaced apart from each other. The shape of the contact portion 130 when viewed in a direction intersecting (orthogonal to) the surface 112 is, for example, a shape in which one corner portion of a rectangle is formed into an arc shape that is convex inward. Here, the contact portion 130 has edges 130e formed in arc shapes provided on the sides facing each other. The intake holes 140 extend from each of openings (openings for intake) 141 in the contact portion 130 toward the surface 111, while being connected and integrated into one hole in the main body 110 so as to reach the extending portion 120. Therefore, there is one opening of the intake hole 140 on the extending portion 120 side.

Here, the suction collet 100 further includes a pair of guide portions 150. The guide portion 150 is provided on the surface 112 so as to protrude from the surface 112. The guide portions 150 face each other and are spaced apart from each other. More specifically, the guide portion 150 is disposed on an axis intersecting the facing direction of the contact portions 130. The shape of the guide portion 150 when viewed in the direction intersecting (orthogonal to) the surface 112 is an L-shape, for example. The guide portions 150 are arranged with 180° shifted directions so as to be symmetrical with respect to the axis in the facing direction of the contact portions 130. Here, the guide portions 150 are arranged so as to define one rectangle (square) by the pair of guide portions 150.

Figure 6:
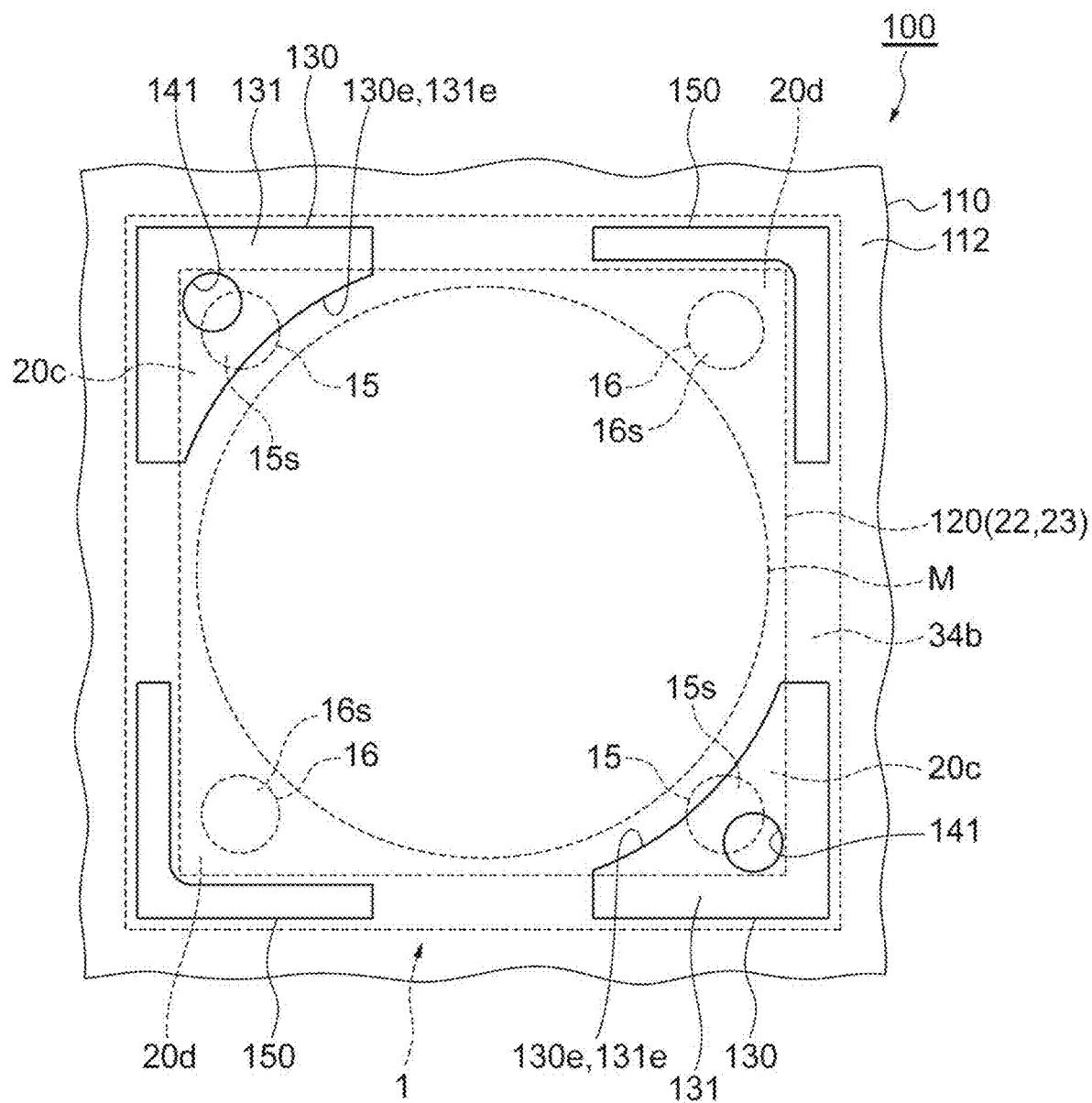
FIG. 6 is a schematic view illustrating a state in which the suction collet illustrated in FIGS. 4 and 5 suctions the Fabry-Perot interference filter.

FIG. 6 is a schematic view illustrating a state in which the suction collet illustrated in FIGS. 4 and 5 suctions the Fabry-Perot interference filter. FIG. 6 is a bottom view (view from the surface 112 side), illustrating a portion of the Fabry-Perot interference filter in a simplified manner by broken lines. As illustrated in FIGS. 5 and 6, the surface of contact portion 130 opposite to the surface 112 is defined as a contact surface (first contact surface) 131 that comes in contact with the terminal 15. The contact surfaces 131 are spaced apart from each other so as to correspond to the terminals 15 in accordance with the arrangement of the contact portions 130 and comes in contact with each of the terminals 15. Here, the contact surface 131 comes in contact with the top surface 15s of the terminal 15. Here, a single piece of the opening 141 of the intake hole 140 is provided on each of the contact surfaces 131.

The opening 141 is partially offset from the terminal 15 in a state where the contact surface 131 is in contact with the terminal 15 (top surface 15s) (hereinafter, sometimes simply referred to as "contact state"). More specifically, here, the opening 141 is circular, and the center of the opening 141 is offset to the outside of the terminal 15 (the side opposite to the membrane structure M) on the axis in the direction facing the terminal 15. With this configuration, a portion of the opening 141 on the side where the contact portions 130 face each other overlaps the terminal 15, while the remaining portion of the opening 141 on the opposite side deviating from the terminal 15. Note that the surface 112 and the main surface 20s face each other and are substantially parallel to each other in the contact state. The above example has described a case where the center of the opening 141 is offset to the outside of the terminal 15. However, there is also a case when the center of the opening 141 is outside the center of the terminal 15 and is offset to the extent not deviating from the terminal 15, a portion of the opening 141 overlaps the terminal 15 while the remaining part deviating from the terminal 15. Furthermore, the offset here means that a deviation has occurred (deviating).

As described above, the edge 130e of the contact portion 130 has an arc shape. With this configuration, in the contact state, the edge 130e of the contact portion 130 on the membrane structure M side and an edge 131e of the contact surface 131 on the membrane structure M side are located outside the membrane structure M and formed along the outer shape of the membrane structure M. Here, the edges 130e and 131e are formed in an arc shape so as to follow the outer edge of the membrane structure M (that is, formed in a shape corresponding to the outer edge of the membrane structure M).

The guide portion 150 is provided, in the contact state, as a location outside the corner portion 20d of the laminated structure 20, which is different from the corner portion 20c in which the terminal 15 is provided, so as to follow the corner portion 20d. More specifically, the guide portion 150 is bent and extended in an L shape along the outer edge of the corner portion 20d, in the contact state. Here, the guide portion 150 is located further outside of the covering portion 33 and is disposed in the thinned portion 34b when viewed in the direction intersecting (orthogonal to) the surface 112 and the main surface 20s, in the contact state.

Here, the height of the guide portion 150 from the surface 112 is substantially the same as the height of the contact portion 130 from the surface 112 (the distance between the surface 112 and the contact surface 131). Therefore, in the contact state, the guide portion 150 does not come in contact with the laminated structure 20 or the Fabry-Perot interference filter 1. However, the height of the guide portion 150 from the surface 112 may be higher than the height of the contact portion 130 from the surface 112 in a range in which the surface of the guide portion 150 opposite to the surface 112 is not in contact with the bottom surface (surface) of the thinned portion 34b, in the contact state. In this case, it is possible to allow the guide portion 150 to overlap the laminated structure 20 along the main surface 20s, in the contact state.

[Embodiment of Suction Method]

Figure 7:
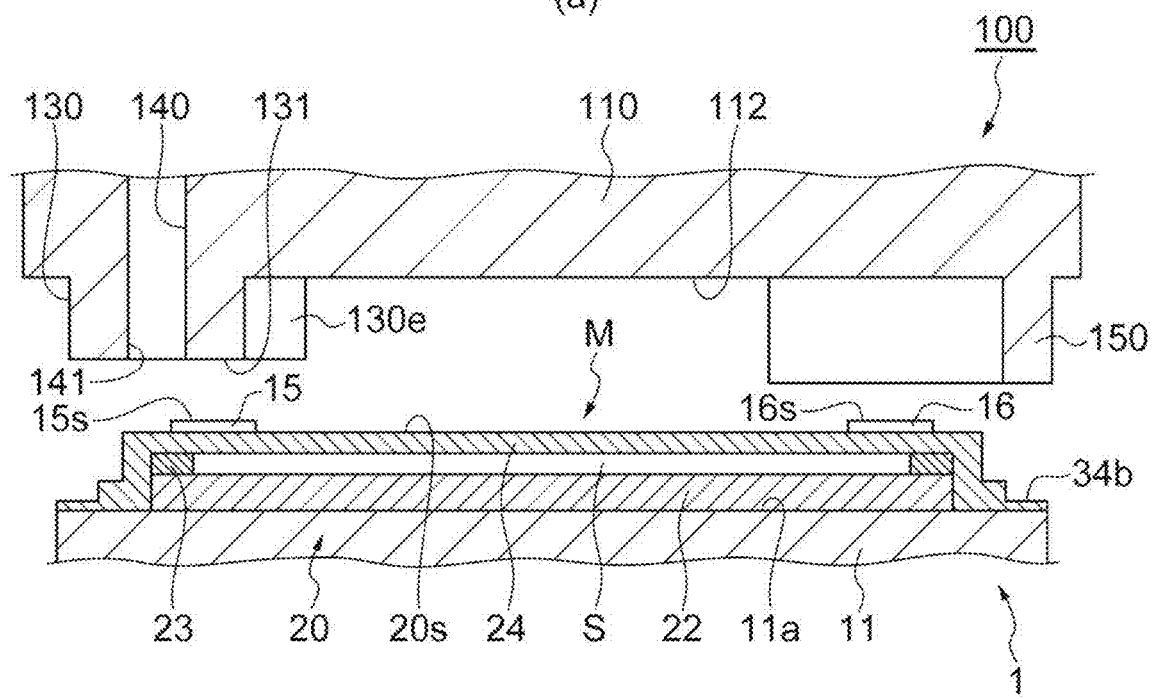
FIG. 7 is a schematic cross-sectional view illustrating steps of a suction method according to the present embodiment.
Figure 7:
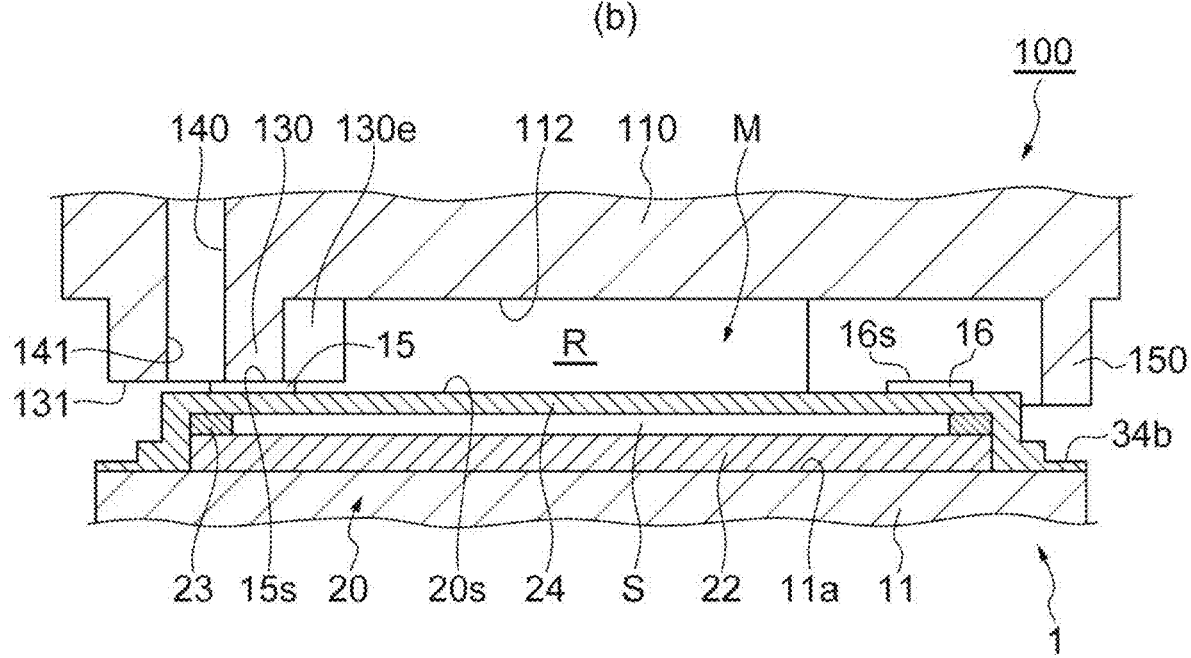

Subsequently, an embodiment of the suction method implemented for the suction of the Fabry-Perot interference filter 1 by using the suction collet 100 will be described. FIG. 7 is a schematic cross-sectional view illustrating steps of the suction method according to the present embodiment. FIG. 7 omits illustrations of the layer structures of the first laminate 22 and the second laminate 24, electrodes, or the like. In this method, first, as illustrated in (a) of FIG. 7, the suction collet 100 is disposed on the Fabry-Perot interference filter 1 (first step). In the first step, the suction collet 100 is arranged such that the surface 112 of the main body 110 of the suction collet 100 faces the main surface 20s of the laminated structure 20 (and the membrane structure M) and such that each of the contact surfaces 131 faces each of the terminals 15.

Subsequently, as illustrated in (b) of FIG. 7, the suction collet 100 is brought into contact with the Fabry-Perot interference filter 1 (second step). In the second step, each of the contact surfaces 131 is brought into contact with each of the terminals 15. In particular, here, the contact surface 131 is brought into contact with the top surface 15s of the terminal 15. According to this, a space R is formed between the surface 112 and the main surface 20s. As illustrated in FIG. 6, the edge 131e is located outside the membrane structure M and follows the outer edge of the membrane structure M. Furthermore, as illustrated in FIGS. 6 and 7, the opening 141 is partially offset from the terminal 15. The guide portion 150 is provided at a location outside the corner portion 20d of the laminated structure 20, which is different from the corner portion 20c in which the terminal 15 is provided, so as to run along the corner portion 20d. Furthermore, the guide portion 150 follows the corner portion 20d outside the corner portion 20d of the laminated structure 20 which is different from the corner portion 20c provided with the terminal 15. These are implemented by the structure of the suction collet 100 and the relative arrangement in the first step.

That is, in the first step, the suction collet 100, in the contact state, is arranged such that the edge 131e of the contact surface 131 is located outside the membrane structure M and follows the outer edge of the membrane structure M. Furthermore, in the first step, the suction collet 100, in the contact state, is arranged such that the opening 141 is partially offset from the terminal 15, and that the guide portion 150 follows the corner portion 20d outside the corner portion 20d of the laminated structure 20 which is different from the corner portion 20c provided with the terminal 15.

In the subsequent step, each of the terminals 15 is suctioned to the contact surface 131 by air intake through the opening 141 of the contact surface 131, whereby suction of the Fabry-Perot interference filter 1 is performed by using the suction collet 100. With this procedure, the state in which the Fabry-Perot interference filter 1 is suction-held by the suction collet 100 is maintained until the air intake through the opening 141 is released. Thereafter, as necessary, the Fabry-Perot interference filter 1 is conveyed together with the suction collet 100 to a predetermined position, and then the air intake through the opening 141 is released so as to detach the Fabry-Perot interference filter 1 from the suction collet 100.

As described above, the Fabry-Perot interference filter 1 to be a suction object of the suction method according to the present embodiment includes the substrate 11 and the laminated structure 20 provided on the substrate 11. The laminated structure 20 includes: the membrane structure M including the first mirror portion 31 and the second mirror portion 32 facing each other via the gap S and in which a distance from each other is variable; and the pair of terminals 15 disposed to face each other via the membrane structure M when viewed in the direction intersecting (orthogonal to) the main surface 20s. In contrast, in the suction collet 100 used in this suction method, the contact portion 130 protruding from the surface 112 of the main body 110 includes the contact surface 131 having the opening 141 for air intake. In addition, in the first step, the suction collet 100 is disposed such that the surface 112 of the suction collet 100 faces the main surface 20s of the Fabry-Perot interference filter 1. At this time, each of the contact surfaces 131 is arranged so as to face each of the terminals 15. Subsequently, in the second step, the suction collet 100 is brought into contact with the Fabry-Perot interference filter 1. At this time, each of the contact surfaces 131 is brought into contact with each of the terminals 15. Subsequently, in the third step, the Fabry-Perot interference filter 1 is suctioned by using the suction collet 100. At this time, each of the terminals 15 is suctioned to the contact surface 131 by the air intake through the opening 141 of the contact surface 131. This makes it possible to suction a limited range such as the terminals 15 at the time of suctioning the Fabry-Perot interference filter. This enables implementation of appropriate level of suctioning, making it possible to stably detach the Fabry-Perot interference filter 1 when the suction is released.

In the suction collet 100, the terminal 15 includes the top surface 15s protruding from the main surface 20s. Subsequently, in the second step, the contact surface 131 is brought into contact with the top surface 15s. In this case, the second step brings the contact surface 131 of the contact portion 130 into contact with the terminal 15 protruding from the membrane structure M. This can avoid contact of the suction collet 100 with the membrane structure M, or even when contact occurs, it is possible to reduce the load on the membrane structure M. Accordingly, it is possible to avoid breakage in the membrane structure M in the suction of the Fabry-Perot interference filter 1, leading to suppression of the occurrence of faulty Fabry-Perot interference filters 1.

In the suction collet 100, in a state where the contact surface 131 is in contact with the terminal 15, the edges 130e and 131e of the contact portion 130 and the contact surface 131 respectively located on the side of the membrane structure M have shapes corresponding to the outer edges of the membrane structure M. Additionally, in the first step, the suction collet 100 is arranged in a state where the contact surface 131 is in contact with the terminal 15, such that the edges 130e and 131e are located outside the membrane structure M and follow the outer shapes of the membrane structure M. This makes it possible to avoid contact with the membrane structure M in the suction of the Fabry-Perot interference filter 1.

In the suction collet 100 in particular, the membrane structure M has a circular shape when viewed in the direction intersecting (orthogonal to) the main surface 20s, and the edges 130e and 131e are formed in arc shapes so as to follow the outer edge of the membrane structure M. This makes it possible to reliably avoid contact with the membrane structure M in the suction of the Fabry-Perot interference filter 1.

Furthermore, the suction method has a configuration in which the first step arranges the suction collet 100 such that the opening 141 on the contact surface 131 of the intake hole 140 is partially offset from the terminal 15 in a state where the contact surface 131 is in contact with the terminal 15. This makes it possible to avoid an excessive increase in the suction force and possible to detach the Fabry-Perot interference filter 1 further stably.

Furthermore, the suction collet 100 includes the guide portion 150 provided on the surface 112 so as to protrude from the surface 112 on an axis intersecting the direction from one contact surface 131 to the other contact surface 131. Each of the terminals 15 is provided at the corner portion 20c of the laminated structure 20 when viewed in the direction intersecting (orthogonal to) the main surface 20s. In addition, in the first step, the suction collet 100 is arranged such that, outside a certain corner portion 20d of the laminated structure 20 which is different from a corner portion 20c provided with the terminal 15, the guide portion 150 follows the certain corner portion 20d, in the contact state. This enables the guide portion 150 to regulate a change in the posture of the Fabry-Perot interference filter 1, making it possible to stably hold and detach the Fabry-Perot interference filter 1.

Furthermore, in the suction collet 100, the guide portion 150 is bent and extends along the outer edge of the corner portion 20d in a state where the contact surface 131 is in contact with the terminal 15. This enables the guide portion 150 to regulate the rotation of the Fabry-Perot interference filter 1 in a plane along the main surface 20s, making it possible to further stably hold and detach the Fabry-Perot interference filter 1.

[Modification Examples]

The above embodiment has described one embodiment of the suction method according to one aspect of the present invention. Therefore, the suction method according to one aspect of the present invention is not limited to the above-described method, and may include a method using an arbitrary modification of the above-described suction collet 100. Subsequently, a modification of the suction collet will be described.

Figure 8:
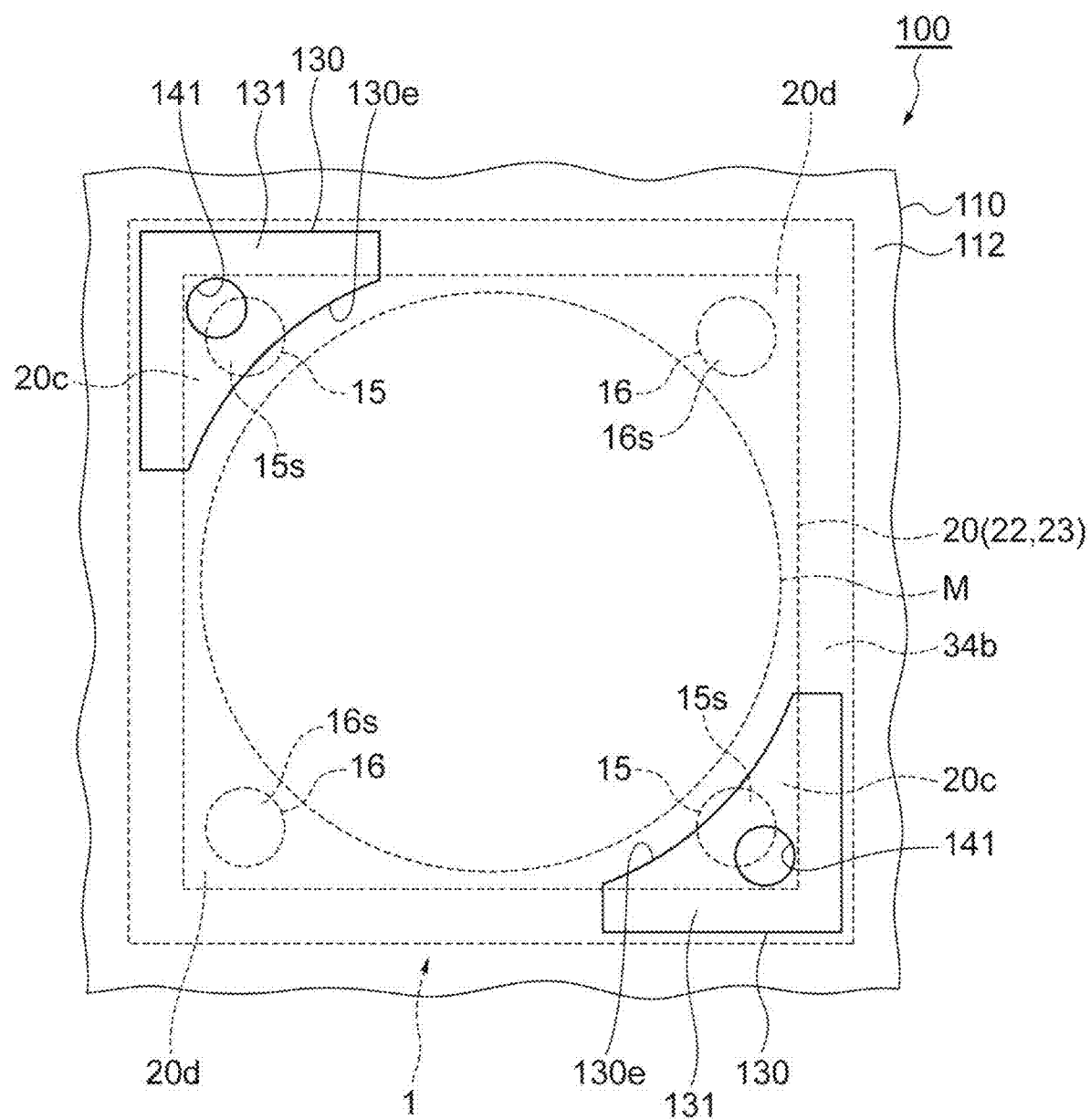
FIG. 8 is a schematic view illustrating a state in which the suction collet according to a modification suctions a Fabry-Perot interference filter.

FIG. 8 is a schematic view illustrating a state in which the suction collet according to a modification example suctions a Fabry-Perot interference filter. FIG. 8 is a bottom view (view from the surface 112 side), illustrating a portion of the Fabry-Perot interference filter in a simplified manner by broken lines. As illustrated in FIG. 8, the suction collet 100 in this example does not include the guide portion 150. In this manner, when the suction collet 100 is configured to suction the pair of terminals 15 facing each other via the membrane structure M, it is possible to achieve stable suction and holding even without providing the guide portion 150. The suction collet 100 may be configured to suction a pair of terminals 15 and 16 facing each other via the membrane structure M.

Figure 9:
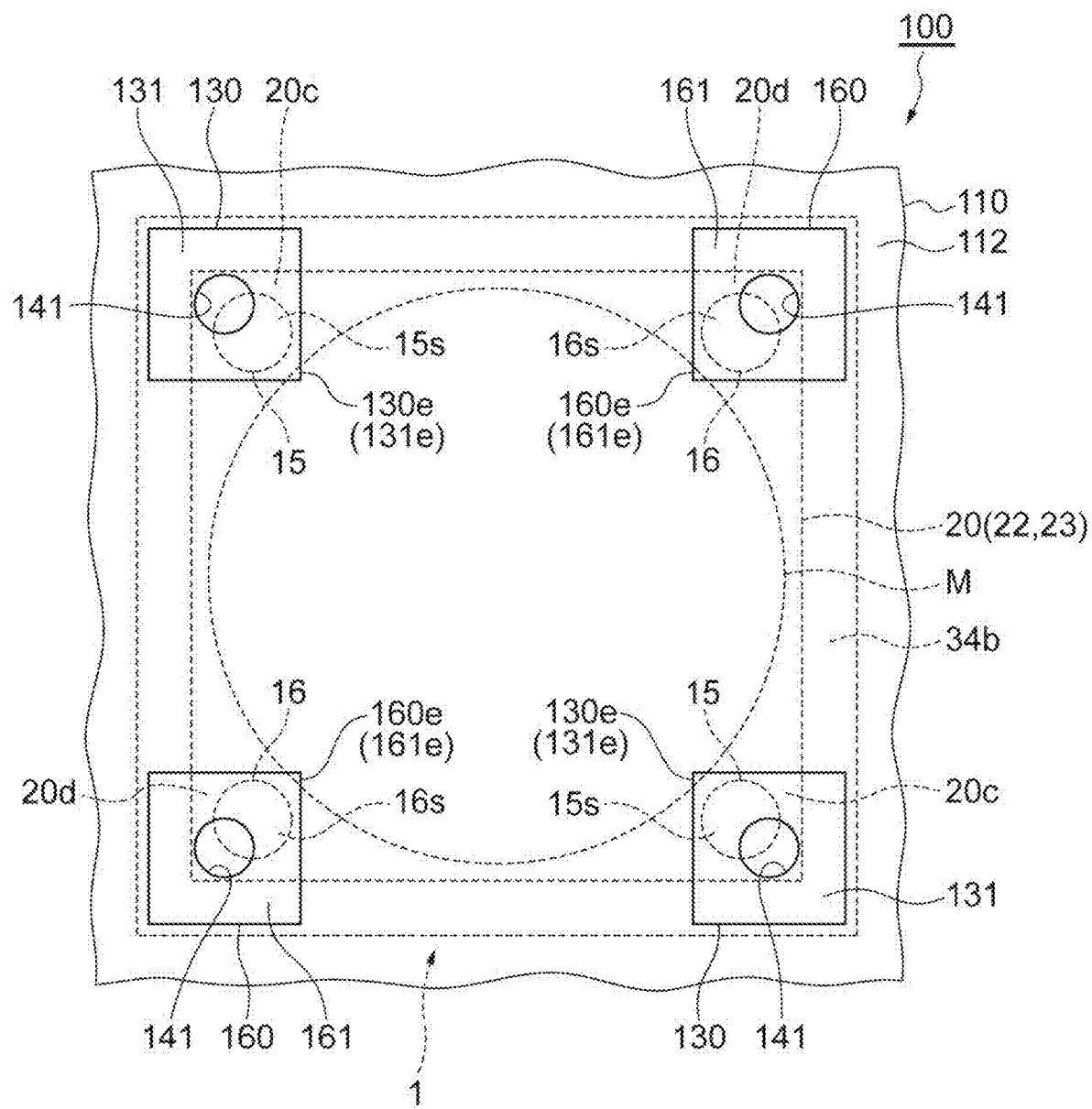
FIG. 9 is a schematic view illustrating a state in which the suction collet according to another modification suctions a Fabry-Perot interference filter.

FIG. 9 is a schematic view illustrating a state in which the suction collet according to another modification example suctions a Fabry-Perot interference filter. FIG. 9 is a bottom view (view from the surface 112 side), illustrating a portion of the Fabry-Perot interference filter in a simplified manner by broken lines. As illustrated in FIG. 9, the suction collet 100 in this example further includes a pair of contact portions 160 provided on the surface 112 so as to protrude from the surface 112. The contact portion 160 is disposed on an axis intersecting a direction from one contact surface 131 to the other contact surface 131. The contact portion 160 is arranged at a position corresponding to the corner portion 20d of the laminated structure 20 in the contact state.

Each of the contact portions 160 is arranged to correspond to each of the terminals 16, and include a contact surface (second contact surface) 161 that comes in contact with the terminal 16. The contact surfaces 161 are spaced apart from each other. The intake hole 140 further opens on the contact surface 161 (the opening 141 for air intake is provided). In the contact surface 161, the opening 141 is also arranged so as to be partially offset from the terminal 16 in the contact state. In the use of the suction collet 100, in the first step of the suction method, the suction collet 100 is arranged such that each of the contact surfaces 161 further faces each of the terminals 16. In the second step, each of the contact surfaces 161 is further brought into contact with each of the terminals 16. Subsequently, in the third step, suction of each of the terminals 16 to the contact surface 161 by the intake air through the opening 141 of the contact surface 161 is further performed. According to this modification, the suction can be performed through the openings 141 arranged at least at three (here, four) mutually different positions, making it possible to further stably suction and hold the Fabry-Perot interference filter 1.

In the example of FIG. 9, the contact portions 130 and 160 and the contact surfaces 131 and 161 are formed in rectangular shapes when viewed in the direction intersecting (orthogonal to) the surface 112. In other words, here, the edges 130e and 160e of the facing sides of the contact portions 130 and 160 (membrane structure M side in the contact state), and the edges 131e and 161e of the facing sides of the contact surfaces 131 and 161 (membrane structure M side in the contact state) are not formed in a shape such as an arc shape following the outer shape of the membrane structure M. Even in such a case, since the contact surfaces 131 and 161 come in contact with the top surfaces 15s and 16s of the terminals 15 and 16, it is possible to avoid contact with the membrane structure M, or even when the contact occurs, the load on the membrane structure M would be reduced.

Note that the contact portion 130 and the contact surface 131 having the shape illustrated in FIG. 9 may be employed even in the examples illustrated in FIGS. 6 and 8. Furthermore, the shapes of the contact portions 130 and 160 and the contact surfaces 131 and 161 may be any other shapes.

The above embodiment will be described as supplementary notes below.

[Supplementary Note 1]

A suction collet used for suction of a Fabry-Perot interference filter including a substrate and a laminated structure that is provided on the substrate and that includes a main surface facing the side opposite to the substrate, the suction collet including:

a main body having a surface; and a contact portion provided on the surface so as to protrude from the surface and including a pair of first contact surfaces, in which the laminated structure includes: a membrane structure including a first mirror portion and a second mirror portion facing each other via a gap and in which a distance from each other is variable and including a portion of the main surface; and a pair of first electrode terminals disposed so as to face each other via the membrane structure when viewed in a direction intersecting the main surface, the main body and the contact portion have an intake hole extending over the main body and the contact portion, the first contact surface is spaced apart from each other so as to correspond to each of the first electrode terminals and is in contact with each of the first electrode terminals, and the intake hole is open to each of the first contact surfaces.

[Supplementary Note 2]

The suction collet according to supplementary note 1, in which the first electrode terminal includes a top surface protruding from the main surface, and the first contact surface comes in contact with the top surface.

[Supplementary Note 3]

The suction collet according to supplementary notes 1 or 2, in which, in a state where the first contact surface is in contact with the first electrode terminal, an edge located on the membrane structure side of the contact portion and the first contact surface is formed so as to be located at the outside of the membrane structure and to follow the outer shape of the membrane structure.

[Supplementary Note 4]

The suction collet according to supplementary note 3, in which the membrane structure has a circular shape when viewed in a direction intersecting the main surface, and the edge is formed in an arc shape so as to follow the outer edge of the membrane structure.

[Supplementary Note 5]

The suction collet according to any one of supplementary notes 1 to 4 in which the opening on the first contact surface of the intake hole is partially offset from the first electrode terminal in a state where the first contact surface is in contact with the first electrode terminal.

[Supplementary Note 6]

The suction collet according to any one of supplementary notes 1 to 5, in which the suction collet includes a guide portion provided on the surface so as to protrude from the surface on an axis intersecting a direction from one first contact surface to the other first contact surface, the first electrode terminal is each provided at a corner portion of the laminated structure when viewed in a direction intersecting the main surface, and the guide portion is provided outside a certain corner portion of the laminated structure, which is different from a corner portion in which the first electrode terminal is provided, so as to follow along the certain corner portion, in a state where first contact surface is in contact with the first electrode terminal.

[Supplementary Note 7]

The suction collet according to supplementary note 6,
in which the guide portion is bent and extended along the outer edge of the certain corner portion in a state where the first contact surface is in contact with the first electrode terminal.

[Supplementary Note 8]

The suction collet according to any one of supplementary notes 1 to 7,
in which the Fabry-Perot interference filter includes a pair of second electrode terminals disposed so as to face each other via the membrane structure when viewed in a direction intersecting the main surface,
the second electrode terminal is disposed on an axis intersecting a facing direction of the first electrode terminals,
the contact portion includes a second contact surface that is disposed so as to correspond to the second electrode terminal and that comes in contact with the second electrode terminal, and
the intake hole further opens onto the second contact surface.

INDUSTRIAL APPLICABILITY

It is possible to provide a suction method capable of stably detaching a Fabry-Perot interference filter.

REFERENCE SIGNS LIST

1 Fabry-Perot interference filter
11 Substrate
15 Terminal (first electrode terminal)
16 Terminal (second electrode terminal)
20 Laminated structure
20s Main surface
20c Corner portion
20d Corner portion (different corner portion)
31 First mirror portion
32 Second mirror portion
100 Suction collet
110 Main body
112 Surface
130, 160 Contact portion
131 Contact surface (first contact surface)
150 Guide portion
161 Contact surface (second contact surface)
140 Intake hole
141 Opening
M Membrane structure

The invention claimed is:

1. A suction method of performing suction of a Fabry-Perot interference filter including a substrate and a laminated structure that is provided on the substrate and that includes a main surface facing a side opposite to the substrate, by using a suction collet, the method comprising:
a first step of arranging the suction collet so as to face the main surface;
a second step of bringing the suction collet into contact with the Fabry-Perot interference filter after the first step; and
a third step of suctioning the Fabry-Perot interference filter by using the suction collet after the second step,
wherein the suction collet includes: a main body having a surface; and a contact portion that is provided on the surface so as to protrude from the surface and that includes a pair of first contact surfaces provided with an opening for air intake,
the laminated structure includes: a membrane structure including a first mirror portion and a second mirror portion facing each other via a gap and in which a distance from each other is variable, and including a portion of a main surface; and a pair of first electrode terminals disposed so as to face each other via the membrane structure when viewed in a direction intersecting the main surface,
in the first step, the suction collet is disposed such that the surface faces the main surface and each of the first contact surfaces faces each of the first electrode terminals,
in the second step, each of the first contact surfaces is brought into contact with each of the first electrode terminals, and
in the third step, each of the first electrode terminals is suctioned to the first contact surface by air intake through the opening provided on the first contact surface.

2. The suction method according to claim 1,
wherein the first electrode terminal includes a top surface protruding from the main surface, and
in the second step, the first contact surface is brought into contact with the top surface.

3. The suction method according to claim 1,
wherein an edge located on the membrane structure side of the first contact surface in a state where the first contact surface is in contact with the first electrode terminal has a shape corresponding to an outer edge of the membrane structure, and
in the first step, the suction collet is arranged such that the edge is located outside the membrane structure and follows the outer edge of the membrane structure in a state where the first contact surface is in contact with the first electrode terminal.

4. The suction method according to claim 3,
wherein the membrane structure has a circular shape when viewed in a direction intersecting the main surface, and
the edge is formed in an arc shape so as to follow the outer edge of the membrane structure.

5. The suction method according to claim 1,
wherein in the first step, the suction collet is arranged such that the opening is partially offset from the first electrode terminal in a state where the first contact surface is in contact with the first electrode terminal.

6. The suction method according to claim 1,
wherein the suction collet includes a guide portion provided on the surface so as to protrude from the surface on an axis intersecting a direction from one first contact surface to the other first contact surface,
the first electrode terminal is each provided at a corner portion of the laminated structure when viewed in a direction intersecting the main surface, and
in the first step, the suction collet is arranged such that, outside a certain corner portion of the laminated structure which is different from a corner portion provided with the first electrode terminal, the guide portion follows the certain corner portion, in a state where the first contact surface is in contact with the first electrode terminal.

7. The suction method according to claim 6,
wherein the guide portion is bent and extended along an outer edge of the certain corner portion in a state where the first contact surface is in contact with the first electrode terminal.

8. The suction method according to claim 1,
wherein the Fabry-Perot interference filter includes a pair of second electrode terminals disposed so as to face each other via the membrane structure when viewed in a direction intersecting the main surface,
the second electrode terminal is disposed on an axis intersecting a facing direction of the first electrode terminals,
the contact portion includes a second contact surface disposed so as to correspond to the second electrode terminal and having an opening for air intake,
in the first step, the suction collet is arranged such that each of the second contact surfaces faces each of the second electrode terminals,
in the second step, each of the second contact surfaces is brought into contact with each of the second electrode terminals, and
in the third step, each of the second electrode terminals is suctioned to the second contact surface by air intake through the opening provided in the second contact surface.

\* \* \* \* \*